United States Patent
Raiteri

Patent Number: 6,059,704
Date of Patent: May 9, 2000

[54] SYSTEM FOR SELECTING TOOLS FROM A TOOL STORE OF A MACHINE TOOL FOR MACHINING PRINTED CIRCUIT BOARDS

[75] Inventor: Angelo Raiteri, Ivrea, Italy

[73] Assignee: Pluritec Italia S.p.A., Borgomanerc, Italy

[21] Appl. No.: 09/163,086

[22] Filed: Sep. 29, 1998

[30] Foreign Application Priority Data

Oct. 2, 1997 [IT] Italy ................................. TO97A0871

[51] Int. Cl.⁷ .................................................. B23Q 3/157
[52] U.S. Cl. .................................. 483/57; 483/51; 483/56
[58] Field of Search ................................ 483/54, 55, 56, 483/57, 51, 53, 901, 36, 30; 364/474.21; 408/43; 409/202, 212

[56] References Cited

U.S. PATENT DOCUMENTS

| | | | |
|---|---|---|---|
| 4,715,108 | 12/1987 | Sugiyama et al. | 483/54 |
| 4,761,876 | 8/1988 | Kosmowski . | |
| 5,230,685 | 7/1993 | Christen et al. | 483/55 |
| 5,376,062 | 12/1994 | Zeichner | 483/56 X |
| 5,462,512 | 10/1995 | Hiroshima et al. | 483/57 |
| 5,716,310 | 2/1998 | Polacek et al. | 483/57 |
| 5,882,286 | 3/1999 | Avfiero | 483/55 |

FOREIGN PATENT DOCUMENTS

| | | | |
|---|---|---|---|
| 0164746 | 7/1986 | Japan | 483/55 |
| 0161233 | 7/1991 | Japan | 483/57 |
| 403166031 | 7/1991 | Japan | 483/55 |

*Primary Examiner*—William Briggs
*Attorney, Agent, or Firm*—Sheridan Ross P.C.

[57] ABSTRACT

The machine has a device for exchanging tools between a tool store and the spindle of a machining head carried by a carriage movable along the X axis; the store has a number of locations for the tools arranged in a matrix of rows and columns; a worktable is movable along the Y axis; and the tool-change device and the store are movable with respect to each other to select the required tool. For which purpose, activatable means are provided to enable the carriage to command the relative movement of the device and the store. A support, movable parallel to the X axis, is engaged by an element carried by the carriage to enable the support to be moved in a given direction in opposition to the action of return springs for restoring the support to a rest position.

21 Claims, 10 Drawing Sheets

SYSTEM FOR SELECTING TOOLS FROM A TOOL STORE OF A MACHINE TOOL FOR MACHINING PRINTED CIRCUIT BOARDS

BACKGROUND OF THE INVENTION

The present invention relates to a system for selecting tools from a tool store of a machine tool for machining printed circuit boards.

Machine tools of the above type normally comprise a device for automatically exchanging tools between the tool store and the spindle of a corresponding machining head movable in a first direction or along an axis X. The store is normally fixed, and comprises a number of tools arranged in a row or in a matrix of rows and columns, and the tool-change device is fitted to the worktable.

Various types of systems for selecting tools from the store are known. In one known machine, the worktable is movable in two coordinate directions; the tool-change device comprises two grippers for respectively gripping the new tool and the used tool to be changed; and the tools are selected by moving the table in the two coordinate directions to align the tool-change device with the tool in the store and with the machining head. On account of the weight of the table, selecting and changing the tool take a fairly long time, thus increasing the running cost of the machine.

In another known machine tool, the machining head is fitted to a carriage movable along the X axis; the table is movable only along the Y axis; and the tool-change device comprises a first gripper fitted to the carriage to extract the new tool from the store and insert the used one, and a second gripper fitted to the table to extract the used tool from the spindle and insert the new one. This system, too, is fairly complicated and expensive.

Another known machine tool comprises a number of machining heads movable along a crosspiece parallel to the X axis, and a corresponding number of stores fitted to a slide, which is driven by a respective motor along the X axis to select the row in each store containing the required tool. The slide and the stores, however, clutter the front of the table, thus complicating loading and unloading of the boards on and off the table.

SUMMARY OF THE INVENTION

It is an object of the present invention to provide a highly straightforward, reliable system for selecting tools from the store, and which provides for eliminating the aforementioned drawbacks typically associated with known systems.

According to the present invention, there is provided a system for selecting tools from a tool store of a machine tool for machining printed circuit boards, said machine comprising a device for exchanging tools between said store and a spindle of a machining head; said machining head being carried by a carriage movable in a first direction; said store having a number of locations for the tools; a worktable being movable in a second direction perpendicular to said first direction; and said device and said store being movable relative to each other to select the required tool; characterized by comprising activatable means for enabling said carriage to command said relative movement as the carriage itself moves in said first direction.

BRIEF DESCRIPTION OF THE DRAWINGS

A number of preferred, non-limiting embodiments of the present invention will be described by way of example with reference to the accompanying drawings, in which.

DETAILED DESCRIPTION OF THE INVENTION

Figure 1:
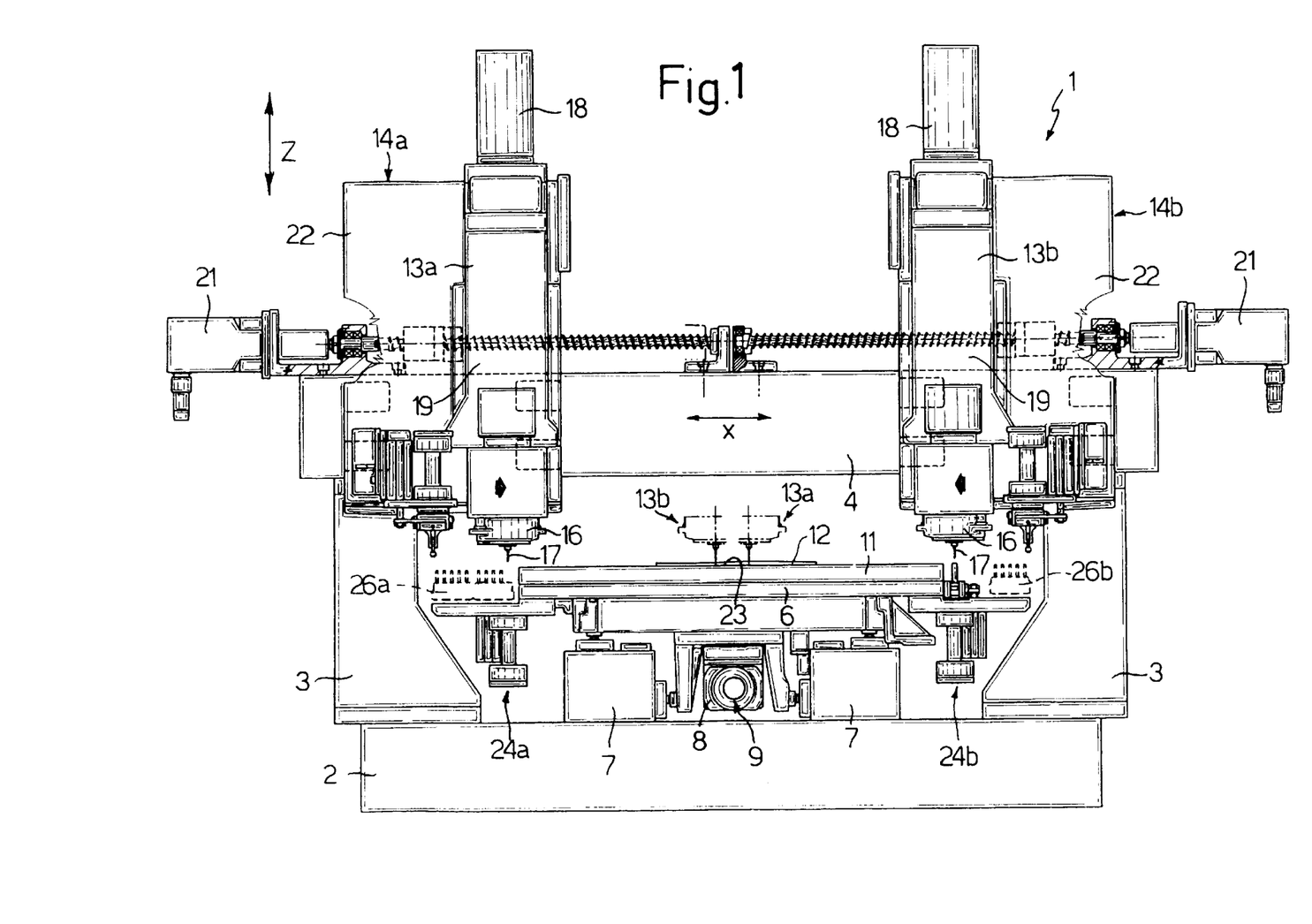
FIG. 1 shows a partially-sectioned front view, with parts removed for clarity, of a machine tool for machining printed circuit boards, and incorporating a first embodiment of a tool selection system in accordance with the present invention.

Number 1 in FIG. 1 indicates as a whole a machine tool, e.g. a drilling unit, for machining printed circuit boards, and which comprises a bed 2 supporting two lateral uprights 3 fitted with a crosspiece 4; and a worktable 6, which slides along two guides 7 extending in a first direction or along an axis Y (FIG. 3), is moved along the Y axis by a reversible numeric-control electric motor 8 (FIG. 1) via a screw-nut screw pair 9, and in turn comprises a fixture 11 for receiving and locating a pack 12 of printed circuit boards for drilling.

Machine 1 also comprises two machining heads 13a, 13b carried by respective carriages 14a, 14b, which slide along crosspiece 4 in a direction perpendicular to the traveling direction of table 6, i.e. along the X axis. Each head 13a, 13b comprises a spindle 16 for receiving a tool 17, and which is movable vertically along the Z axis by a respective reversible numeric-control electric motor 18.

Carriages 14a, 14b are moved along the X axis independently of each other by two screw-nut screw pairs 19, each activated by a respective reversible numeric-control electric motor 21. Each carriage 14a, 14b comprises a vertical front plate 22 to which respective machining head 13a, 13b is fitted; both heads 13a, 13b may machine the same pack 12 of printed circuit boards simultaneously; and each carriage 14a, 14b may be moved towards the center of crosspiece 4 to obtain an overlapping portion 23 of table 6 where the boards may be drilled by either of heads 13a, 13b.

Each machining head 13a, 13b comprises a respective device 24a, 24b for changing tools 17, and a respective store 26a, 26b for storing tools 17 arranged in a matrix of rows and columns. In FIG. 1, stores 26a, 26b are indicated schematically by dash lines; device 24a and store 26a are symmetrical with respect to device 24b and store 26b; and, for the sake of simplicity, reference is made in the following description to device 24a and store 26a of machining head 13a only, though the same also applies to device 24b and store 26b of head 13b.

Device 24a for changing tools 17 is fitted to bed 2, and store 26a to table 6; and device 24a comprises a pneumatic gripper 28 substantially as described in Italian Patent n. 1.251.252.

Gripper 28 faces upwards and is fitted by a bracket 29 to a slide 31 movable vertically along a prismatic guide 32 integral with a bracket 33 supporting a vertical-axis pneumatic cylinder 34. Cylinder 34 controls a rod 35 connected to slide 31 by a bar 36 (FIG. 3) having an appendix 37, which is arrested against a shoulder 38 of a plate 39 fitted to upright 3.

Store 26a (FIG. 2) is fitted removably inside a seat 40 fitted to the corresponding lateral edge of table 6, and comprises a number of strips 41, each supporting a row of tools 17 oriented with the tips downwards. Each strip 41 is fitted removably to store 26a, and retains tools 17 inside the respective seats by means of known elastic tabs.

The system for selecting tools 17 comprises means for moving store 26a with respect to device 24a. More specifically, slide 31 is fitted to a support or carriage 42, which slides along a further prismatic guide 43 (FIG. 3) fitted to bed 2 and parallel to crosspiece 4. Carriage 42 is normally maintained in a rest position by elastic means defined by a pair of springs 44 (FIGS. 2 and 4), and comprises an adjustable element 46 which is normally pushed by springs 44 to rest against a fixed stop 47 on bed 2 (position shown by the dash line in FIG. 2).

Figure 2:
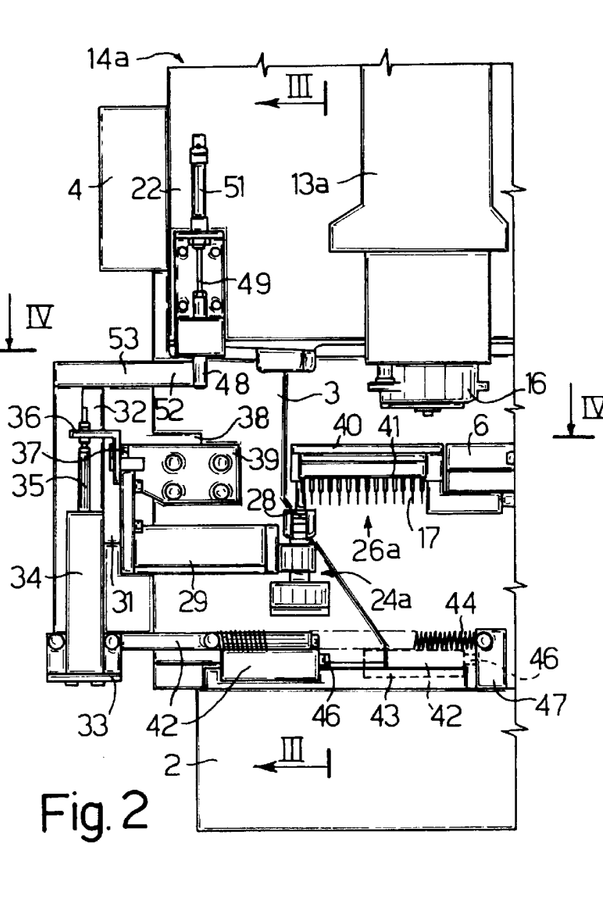
FIG. 2 shows a larger-scale detail of FIG. 1.

The tool selection system also comprises activatable means for enabling carriage 14a to move carriage 42 along guide 43 as carriage 14a itself moves along the X axis. Which activatable means comprise an element or pin 48, which is fitted to a rod 49 of a linear actuator defined by a pneumatic cylinder 51 fitted to plate 22 of head 13a, and engages a shoulder 52 of an arm 53 integral with prismatic guide 32 and therefore also with carriage 42.

Figure 3:
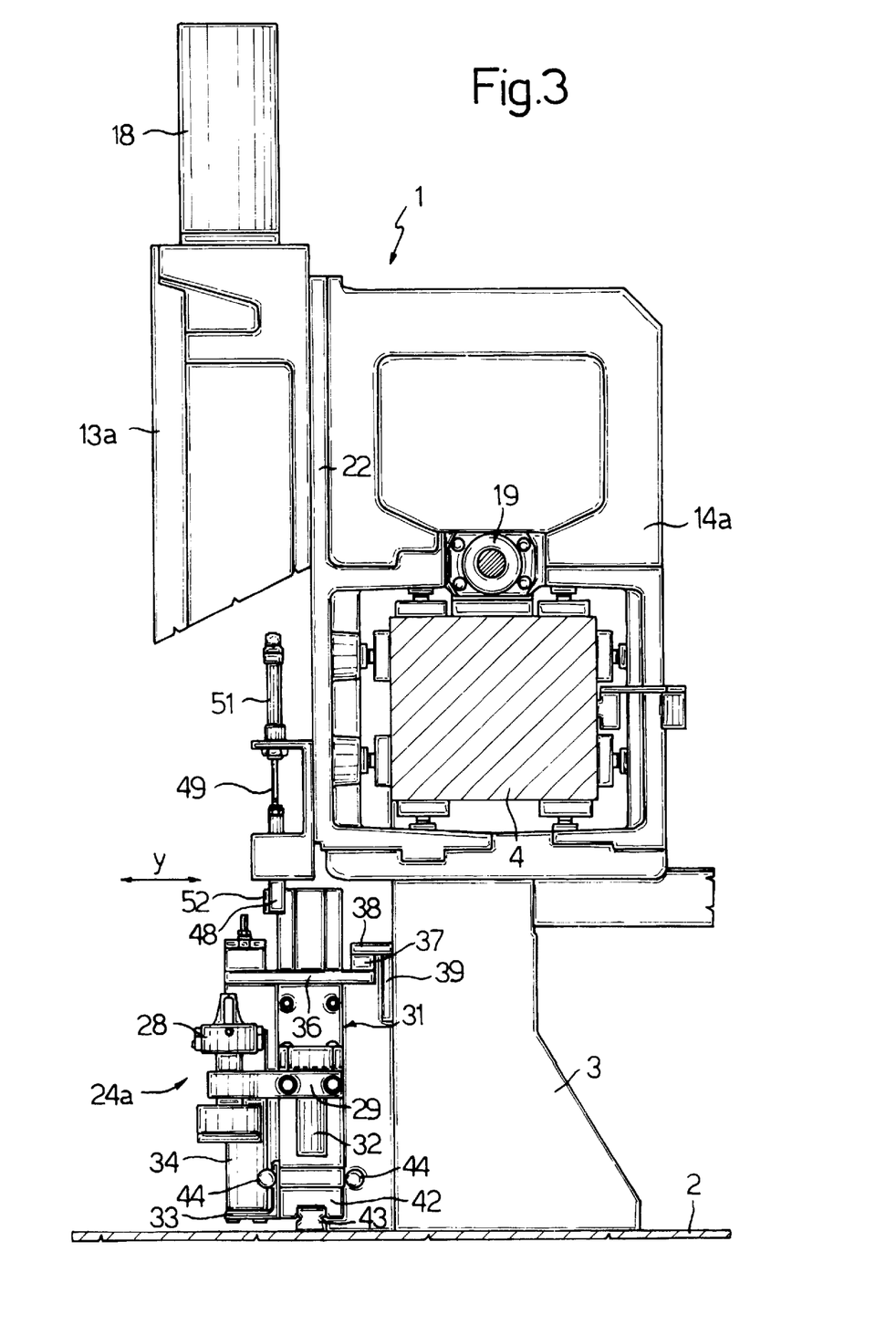
FIG. 3 shows a section along line III—III in FIG. 2.

More specifically, when cylinder 51 is activated, carriage 14a positioned as shown in FIG. 1 to at a new tool 17, pin 48 moves down into the FIGS. 2 and 3 position, i.e. engaging shoulder 52. As carriage 14a is moved further to the left, pin 48, by means of arm 53 and guide 32, shifts carriage 42, so that gripper 28 is moved along the X axis by carriage 14a itself to select the row containing the tool 17 to be withdrawn, or the location in which to insert a used tool 17 of head 13a.

Devices 24a, 24b may change tools 17 either simultaneously or independently of each other. To exchange tools 17 between spindle 16 of head 13a and store 26a, motor 21, via screw-nut screw pair 19, first sets carriage 14a to a tool-change position in which spindle 16 is aligned with gripper 28; and cylinder 34 and gripper 28 are then activated to withdraw the used tool 17 from spindle 16.

Figure 4:
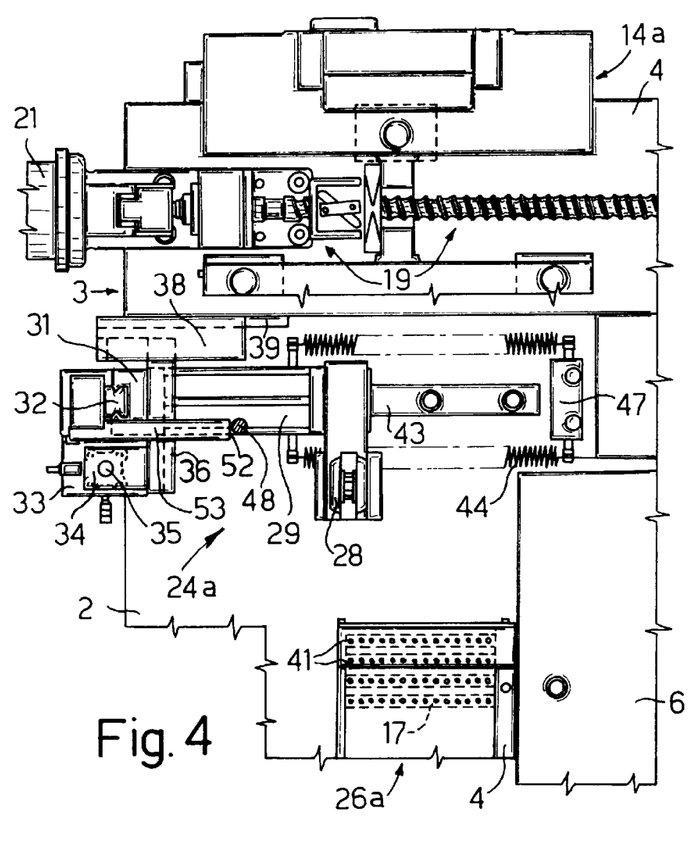
FIG. 4 shows a section along line IV—IV in FIG. 2.

Table 6 is then moved to select the strip 41 in store 26a into which the used tool 17 is to be inserted; cylinder 51 lowers pin 48 into the FIGS. 2 and 4 position; carriage 14a is moved to shift carriage 42 and bring gripper 28 up to the row into which the used tool 17 is to be inserted; and gripper 28 is activated to insert tool 17 into store 26a.

Both table 6 and carriage 14a are then moved to select the strip 41 and the row in store 26a from which the new tool 17 is to be withdrawn; gripper 28 is again activated to withdraw the new tool 17 from store 26a; carriage 14a is restored to the tool-change position; cylinder 51 is activated to raise and disengage pin 48 from shoulder 52, so that device 24a is restored to the rest position by springs 44; and, after moving carriage 14a to align spindle 16 and gripper 28, gripper 28 is activated to insert the new tool 17 into spindle 16.

Figure 5:
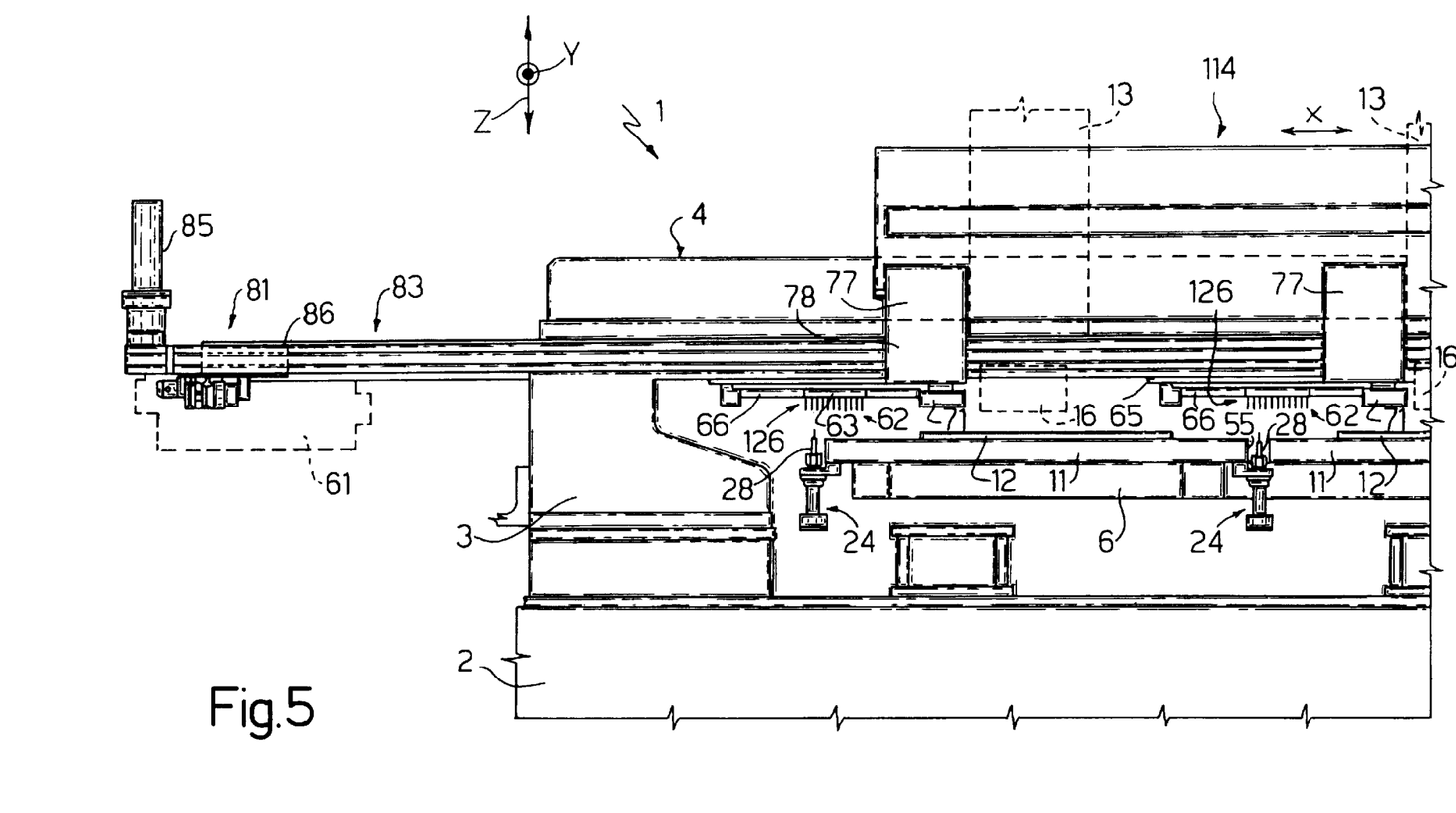
FIG. 5 shows a partial front view of a further machine tool incorporating a further embodiment of a tool selection system in accordance with the present invention.
Figures 6, 7:
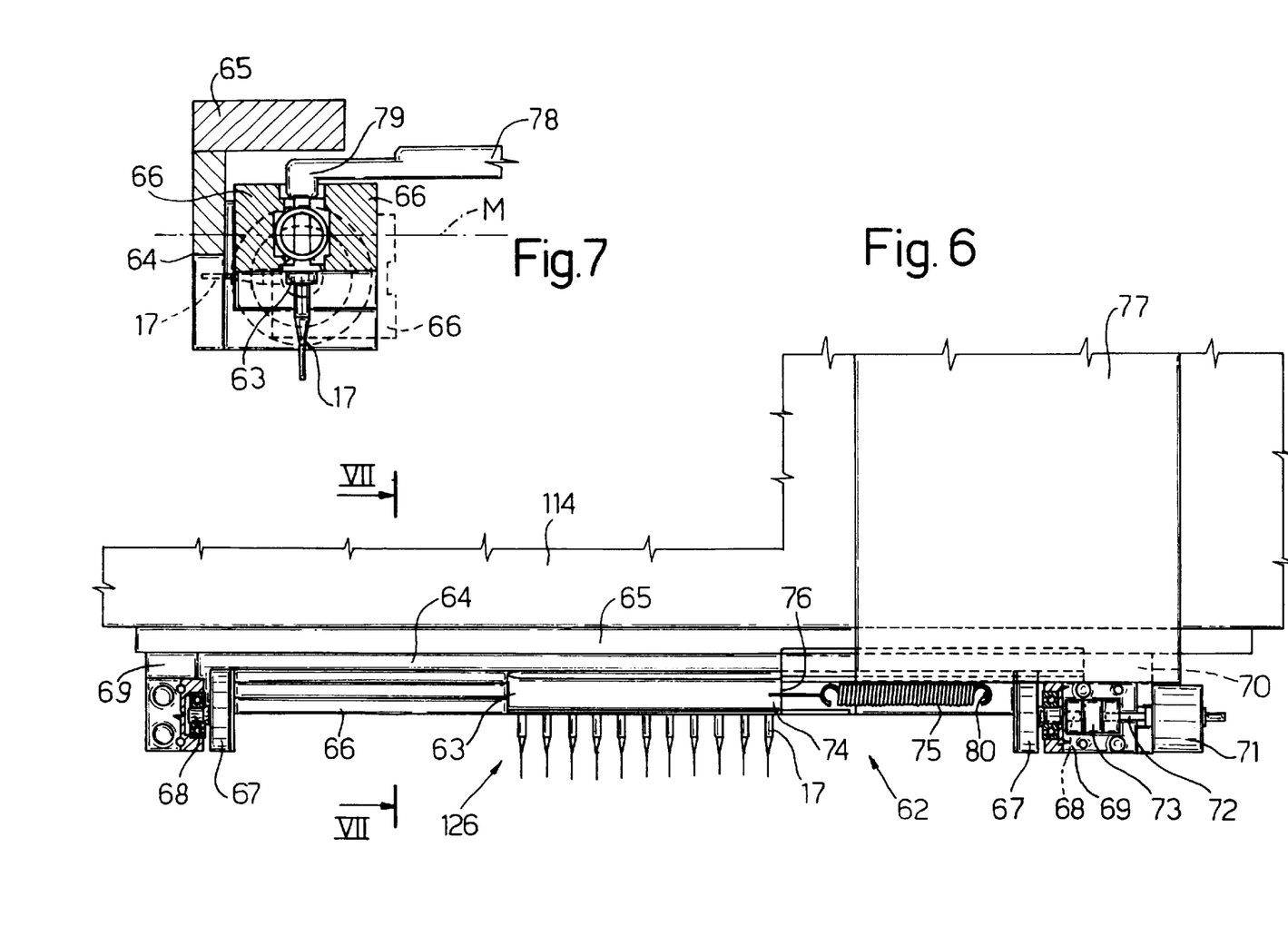
FIG. 6 shows a larger-scale detail of FIG. 5.
FIG. 7 shows a larger-scale section along line VII—VII in FIG. 6.

In the FIGS. 5–7 embodiment, machine tool 1 comprises a number of machining heads 13 associated with a corresponding number of stores 126 and fitted to a common carriage 114; worktable 6 is movable along the Y axis; carriage 114 travels along crosspiece 4 and the X axis, and carries two rows of machining heads 13, each defined for example by four heads 13, only two of which are shown in FIG. 5; and each two corresponding heads 13 in the two rows define a pair of heads 13.

Each pack 12 of printed circuit boards is placed for machining on a respective fixture 11 associated with a head 13 and fitted to table 6, which therefore carries four pairs of fixtures 11 separated by gaps 55. The first pair of fixtures 11 on the left is flanked by a first pair of devices 24 for changing tools 17, each device being associated with a respective head 13 in the corresponding pair; each of the spaces 55 between pairs of fixtures 11 houses a respective pair of devices 24 associated with heads 13 in the next pair to the right; each device 24 comprises a pneumatic gripper 28 for gripping a tool 17; and gripper 28 is moved along the Z axis by a corresponding pneumatic piston (not shown).

Each pair of machining heads 13 is assigned an intermediate station 62 containing a store 126 for tools 17. Store 126 comprises a container 63 (FIG. 6) for housing one row of tools 17, and which is fitted to a support 64 integral with a plate 65 fitted beneath crosspiece 4; and support 64 comprises a guide defined by two prismatic bars 66 (FIG. 7) parallel to crosspiece 4 and between which container 63 is housed in sliding manner.

Bars 66 have a median plane M perpendicular to the axes of tools 17, and are connected to each other by two sides 67, each having a pin 68. Support 64 comprises two sides 69 to which the two pins 68 are fitted in rotary manner; and, in the FIG. 7 position, the axis of pins 68 is below the median plane M of bars 66. An appendix 70 of support 64 is fitted with a pneumatic motor 71 having a shaft 72, which is rotated between two positions at 90° to each other, and is connected by a joint 73 to the adjacent pin 68.

Bars 66 are normally so positioned by motor 71 that container 63 positions tools 17 horizontally as shown by the dash line in FIG. 7; which position serves for transferring tools 17 between container 63 and a common remote store 61 indicated by the dash line in FIG. 5. When rotated 90°, motor 71, by means of bars 66, moves container 63 into a vertical tool-change position, with the tips of the tools facing downwards as shown in FIGS. 5 and 7.

A spring 75 is fitted between a pin 80 (FIG. 6) on support 64 and one end 74 of container 63, and provides for normally holding container 63 against a stop 76 fitted to bars 66. Carriage 114 is fitted, to the side of respective head 13, with a plate 77 supporting an arm 78, which terminates with an appendix 79 (FIG. 7) for engaging end 74 of container 63.

When container 63 is rotated into the tool-change position, appendix 79 draws container 63 parallel to crosspiece 4, in opposition to spring 75, to select each time the location of the required tool 17. Conversely, when container 63 is set with tools 17 positioned horizontally, appendix 79, by virtue of the position of pins 68, fails to encounter bars 66 and therefore travels freely.

Tools 17 are transferred between containers 63 and remote store 61 (FIG. 5) by a transfer device indicated as a whole by 81, and which serves stations 62 sequentially as described in a patent application filed concurrently by the present Applicant and entitled "Tool-change system for a machine tool with a number of machining heads."

To change tools 17 in spindles 16, operation of transfer device 81 is suspended temporarily; a control unit operates pneumatic motors 71 (FIGS. 5 and 6) to rotate bars 66, together with containers 63, to position tools 17 vertically; and the control unit then moves carriage 114 (FIG. 5) and table 6 along respective axes X and Y to align the axes of spindles 16 with grippers 28 for changing tools 17, and to withdraw the respective used tools 17 from spindles 16.

The control unit then moves carriage 114 selectively leftwards so that appendixes 79 (FIGS. 6 and 7) of arms 78 engage ends 74 of respective containers 63; each container 63 is drawn in opposition to spring 75 to align the location in container 63 into which the used tool 17 is to be inserted with the gripper 28 (FIG. 5) relative to the front machining head 13 in each pair; and gripper 28 then inserts the used tool 17 inside container 63. The above operation is repeated to insert into containers 63 the tools 17 extracted by grippers 28 relative to machining heads 13 in the rear row.

Two successive operations, similar to those described above, are then performed, whereby appendixes 79 position containers 63 to withdraw the new tools 17 first by grippers 28 of the front row of heads 13, and then by grippers 28 of the rear row of heads 13. Once carriage 114 and table 6 are repositioned, grippers 28 are operated simultaneously each time to insert the new tools 17 inside respective spindles 16; and motor 71 rotates support 64 to set container 63 and tools 17 to the transfer position and so enable machine 1 to continue machining packs 12 of printed circuit boards and transferring tools 17 between remote store 61 and containers 63.

Figure 8:
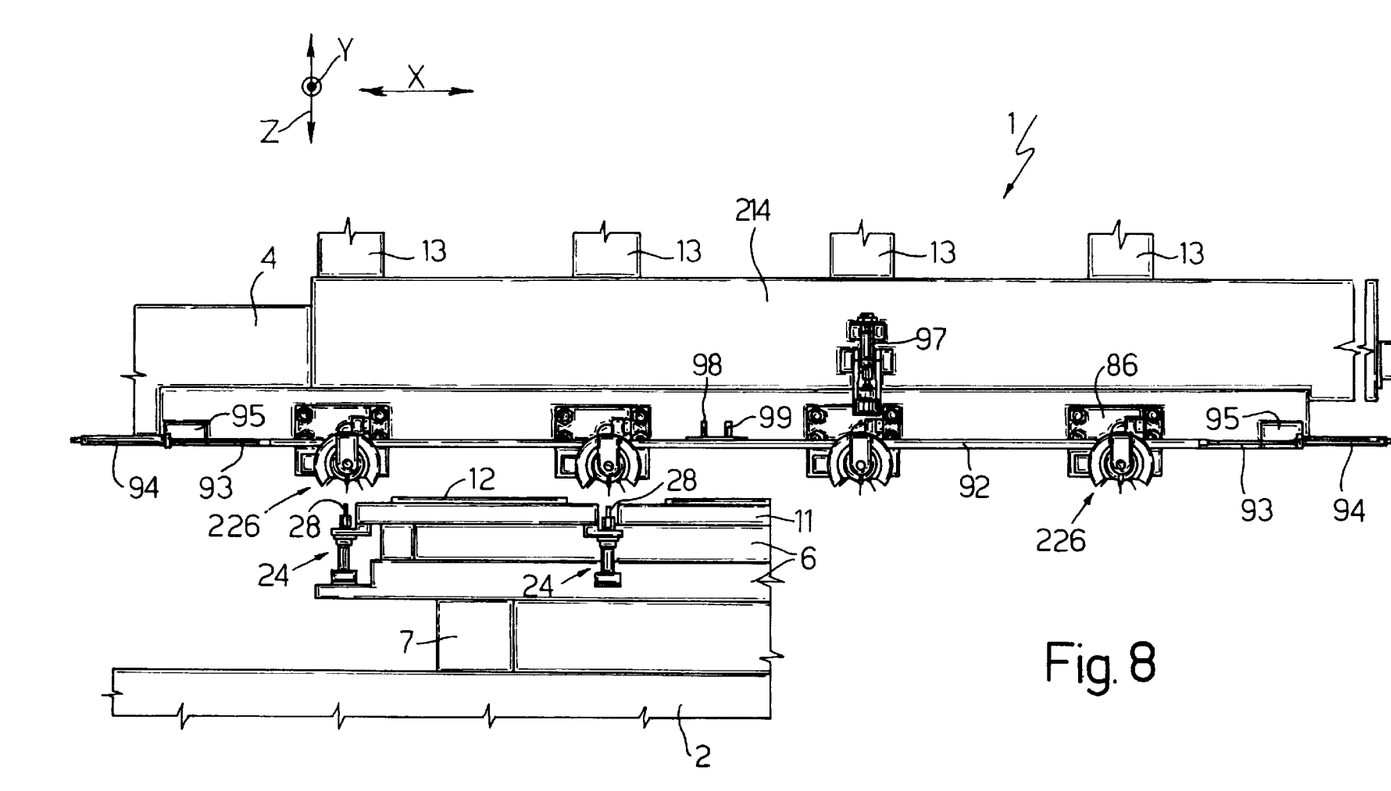
FIG. 8 shows a partial rear view of a further machine tool incorporating a further embodiment of a tool selection system in accordance with the present invention.

In the FIGS. 8–11 embodiment, machine tool 1 comprises a number of machining heads 13 associated with a corresponding number of stores 226 for tools 17, substantially as described in Patent application N. TO94A000958. Heads 13 are fitted to a common carriage 214 movable along crosspiece 4 parallel to the X axis; the worktable 6 of machine 1 in FIG. 8 is movable in known manner along the Y axis on guides 7 fitted to bed 2; and each machining head 13 comprises a vertical-axis tool spindle for receiving a tool 17, and which is movable along a vertical axis Z.

Each pack 12 of printed circuit boards is placed for machining on a respective fixture 11 fitted to table 6, which carries a number of devices 24 for changing tools 17, only two of which are shown in FIG. 8. Each device 24 is associated with a machining head 13; and each store 226 for tools 17 is defined by a drum 82 (FIGS. 9–11) for housing a number of, e.g. twelve, rows of tools 17.

Each row of tools 17 is located in a predetermined angular position on drum 82, and may receive, for example, two clips or strips 83 of tools 17 similar to strips 41 in FIGS. 2 and 4. Drum 82 is fitted removably to a shaft 84, substantially as described in European Patent N. 541.020; each shaft 84 is fitted to a plate 86 in turn fitted to a rear bar 87 of carriage 214; and drum 82 comprises a fixed guard 88 for tools 17.

Each shaft 84 is fitted with a gear 89 integral with a face-toothed bush 90; each drum 82 is integral with a face-toothed bush 91 engaging bush 90; gears 89 mesh with a rack 92, the two ends of which are connected to two piston rods 93 (FIG. 8) of two pneumatic cylinders 94; and pneumatic cylinders 94 are fitted to two brackets 95 in turn fitted to bar 87, and provide for maintaining bar 87 elastically in a central rest position.

Figure 9:
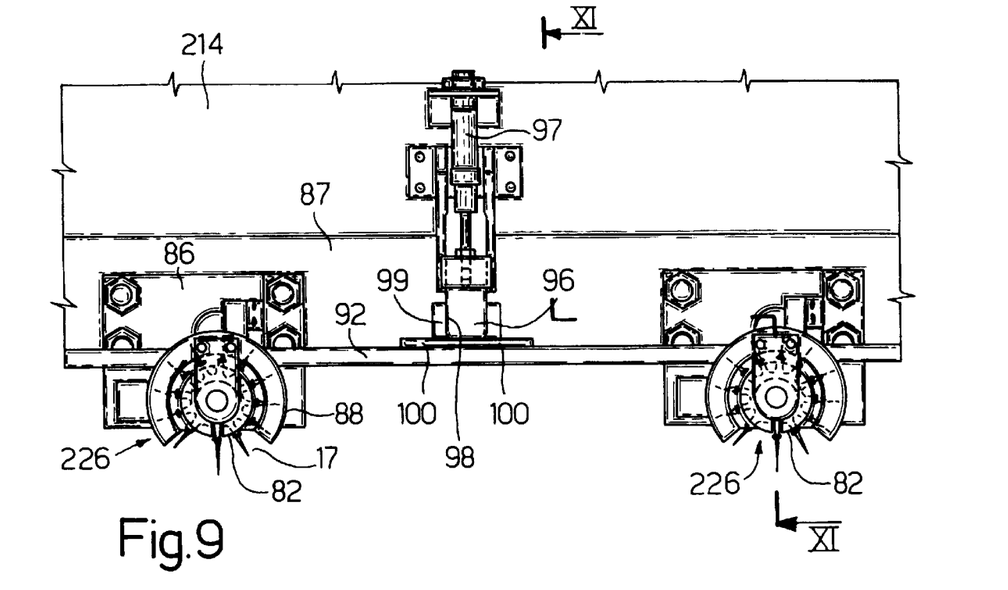
FIG. 9 shows a larger-scale detail of FIG. 8 in a different operating position.
Figures 10, 11:
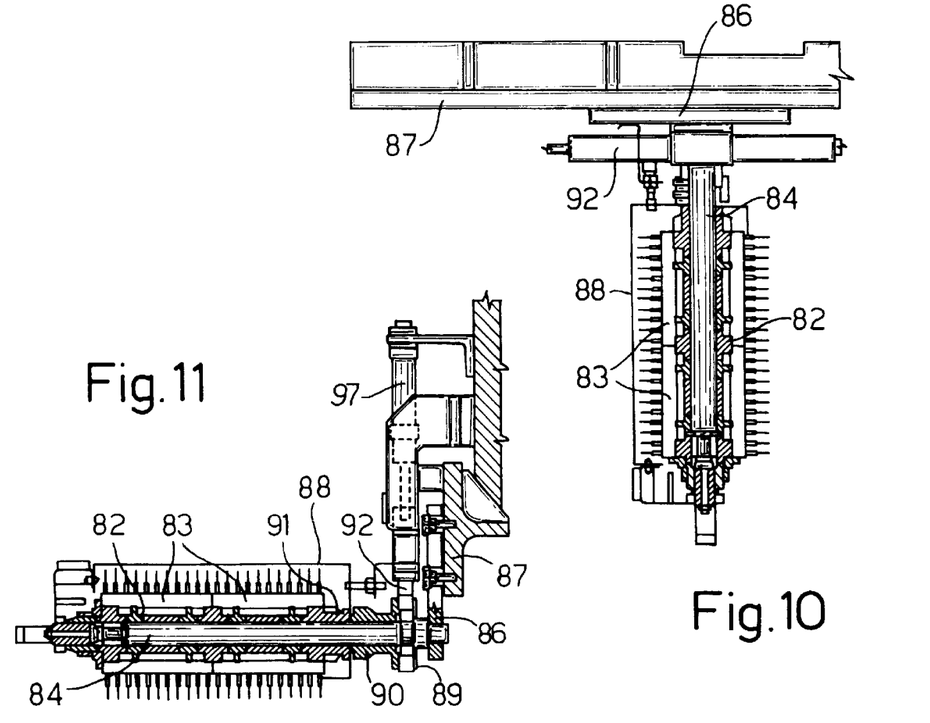
FIG. 10 shows a partially-sectioned top plan view of a detail in FIG. 9.
FIG. 11 shows a section along line XI—XI in FIG. 9.

The selection system also comprises activatable means comprising an element or pin 96 (FIG. 9), which is carried by the piston of a pneumatic cylinder 97 fitted to the rear wall of carriage 214, and provides for engaging a cavity 98 between two appendixes 99 carried on a plate 100 integral with rack 92, as shown in FIG. 9.

When cylinder 97 is activated, with carriage 214 positioned to select a new tool 17 as shown in FIG. 8, pin 96 is lowered to engage cavity 98 between appendixes 99. Rack 92 is thus made integral with, and is moved along the X axis by, carriage 214 to rotate drums 82 simultaneously clockwise or anticlockwise and so align with gripper 28 the row of tools from which to select the new tool 17 for respective head 13.

To exchange tools 17 between each head 13 (FIG. 8) and respective store 226, a control unit first positions carriage 214 so that head 13 and the spindle are aligned with respective gripper 28; gripper 28 is activated to extract the used tool 17; and table 6 is moved to select the row in store 226 into which the used tool 17 is to be inserted.

At the same time, cylinder 97 is activated to engage pin 96 inside cavity 98 between appendixes 99; carriage 214 is then moved to rotate drum 82, by means of rack 92 and gear 89, to align over gripper 28 the angular location of the strip 83 into which the used tool 17 is to be inserted; and gripper 28 is activated to insert tool 17 inside drum 82.

Both table 6 and carriage 214 are then moved to select the row and column from which to extract the new tool 17 from drum 82; gripper 28 is again activated to extract the new tool 17 from drum 82; cylinder 97 is then activated to raise and disengage pin 96 from appendixes 99; pneumatic cylinders 94 (FIG. 8) restore rack 92 to the rest position; carriage 214 is moved to align the spindle with gripper 28; and the new tool 17 is inserted inside the spindle of head 13.

In the FIGS. 12–15 embodiment, machine tool 1 comprises a number of machining heads 13, which are fitted with respective tool-holder spindles 16, are associated with a corresponding number of stores 326, are fitted to a common carriage 114 movable along crosspiece 4 along the X axis, and are arranged in two rows of four heads 13 as in the FIGS. 5–7 embodiment.

Worktable 6 is movable along the Y axis, and carries four pairs of fixtures 11 separated by gaps 55, and five pairs of pickup devices 24, three pairs of which are located in gaps 55, and two pairs of which are located alongside the first and last pair of fixtures 11. Each device 24 comprises a gripper 28 similar to the one in FIG. 5.

Figure 12:
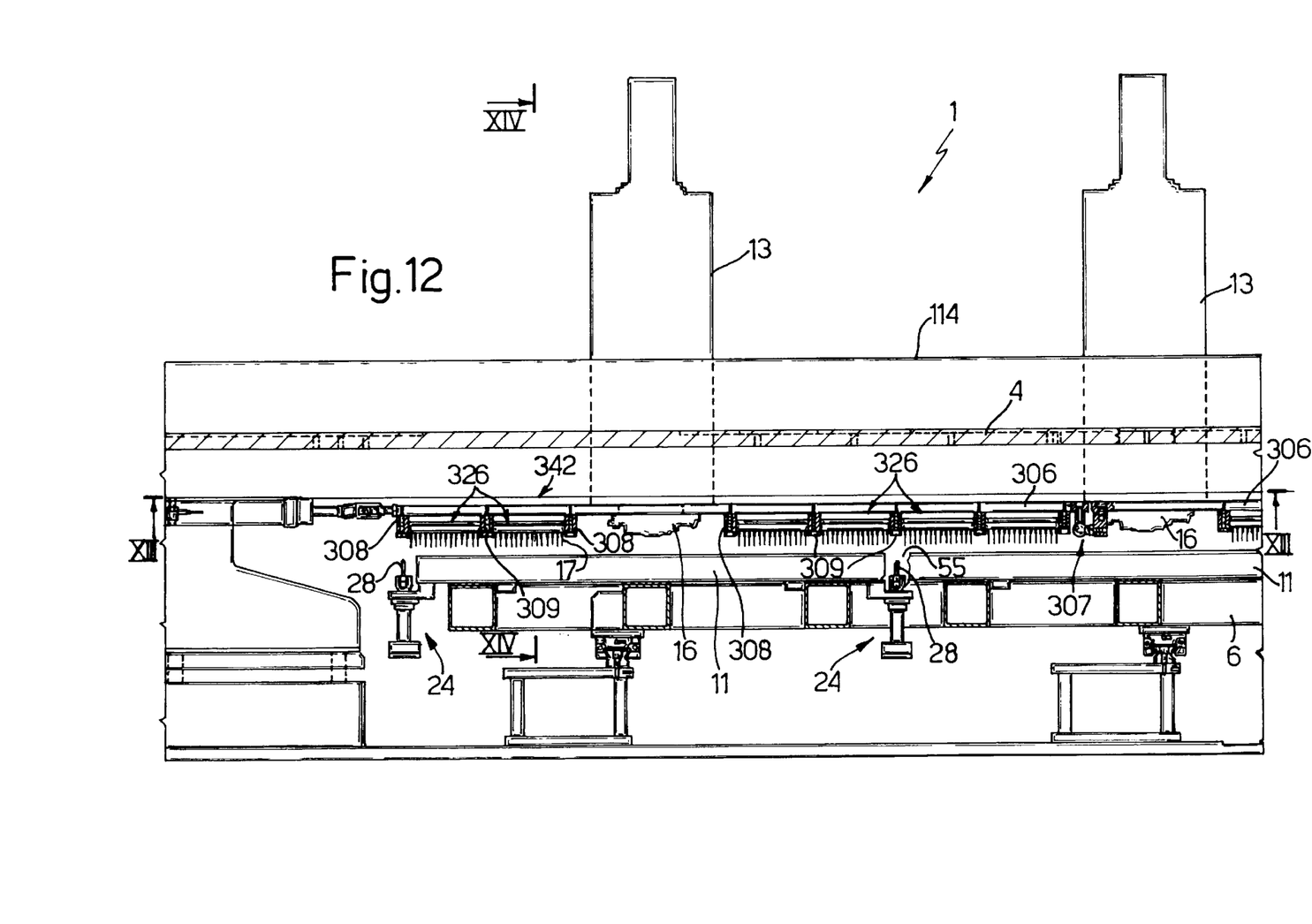
FIG. 12 shows a partial front view of a variation of the FIG. 5 machine tool incorporating a further embodiment of a tool selection system in accordance with the present invention.

Carriage 114 is defined by two parallel box bars 56 connected to each other by a number of cross members 57, connected by a horizontal plate 54; bars 56 are each reinforced by two prismatic bars 45, 50 parallel to the X axis and for securing heads 13 to carriage 114; each bar 45 carries a number of shoes 58 engaging a corresponding prismatic guide 59; and carriage 114 is moved along the X axis by an electric motor (not shown) via a screw-nut screw pair 60.

Each pair of heads 13 is associated with at least one store 326, which is common to both heads 13. In particular, sixteen stores 326 are provided, only seven of which are shown in FIG. 12, and which are arranged along crosspiece 4 so that each pair of heads 13 is associated with four stores 326. At the center of carriage 4, shown in FIG. 12, two of the four stores 326 of each pair of heads 13 are located to the right and two to the left of the corresponding pair of heads 13.

Each store 326 is in the form of a box 301 (FIGS. 14 and 15) containing a number of tools 17 arranged in a matrix of rows and columns; each box 301 (FIG. 15) comprises two guide edges 302, and carries a number of dividing elements between which are housed a number of clips, each defined by a known strip 303 made of plastic material and supporting a row of fourteen, e.g. collarless, tools 17; and each box 301 (FIG. 14) contains twenty-eight strips 303, i.e. fourteen strips 303 for each head in the pair.

Stores 326 are carried by a common support indicated as a whole by 342, and which is movable parallel to carriage 114. In particular, support 342 slides along two guides 304 parallel to the X axis and fitted to horizontal plate 54 of crosspiece 4, and, for practical reasons, is defined by three prismatic bars 306 (FIG. 13) connected to one another by articulated joints 307.

Figure 13:
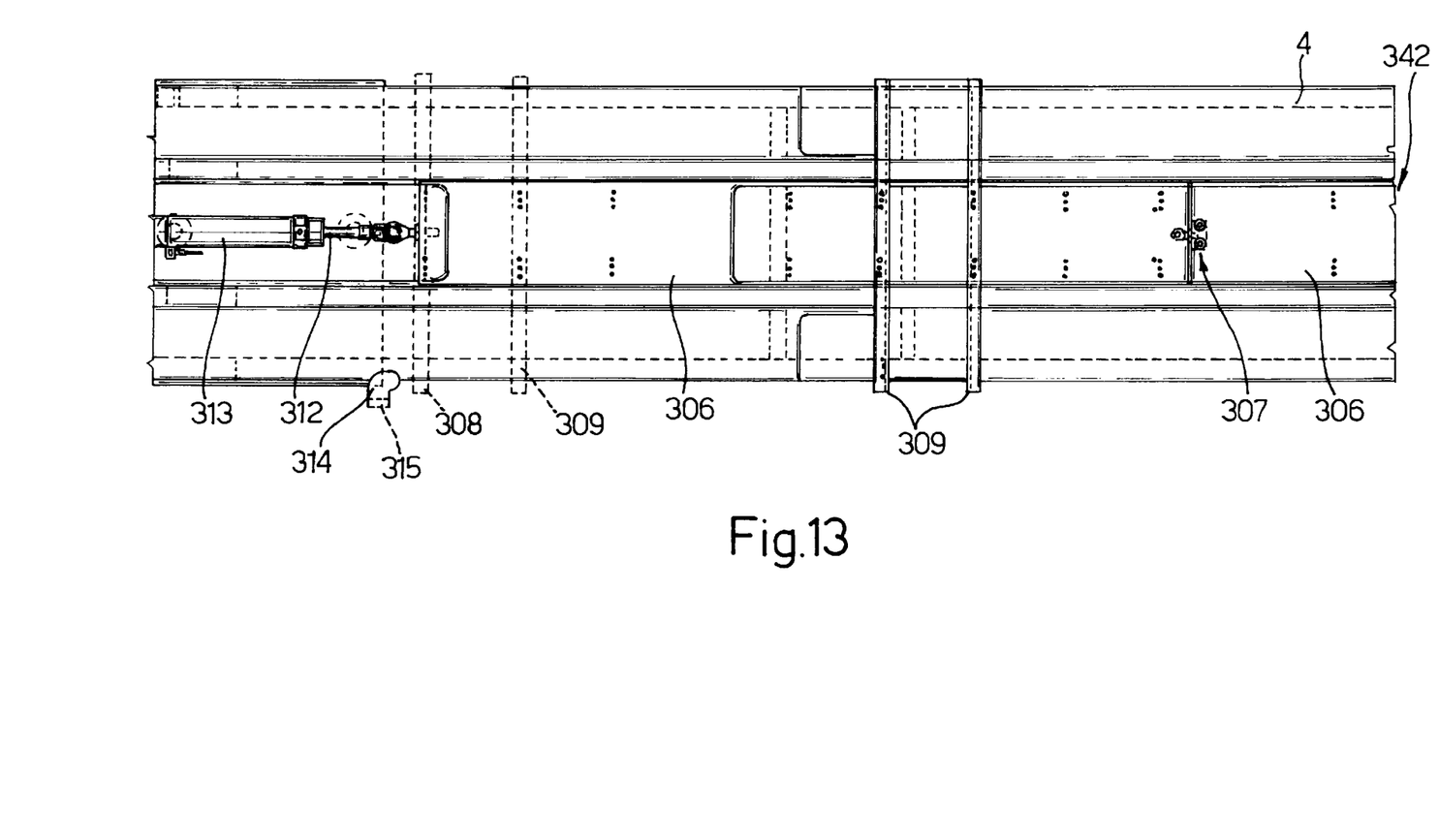
FIG. 13 shows a partial bottom horizontal section, with parts removed for clarity, along line XIII—XIII in FIG. 12.
Figure 14:
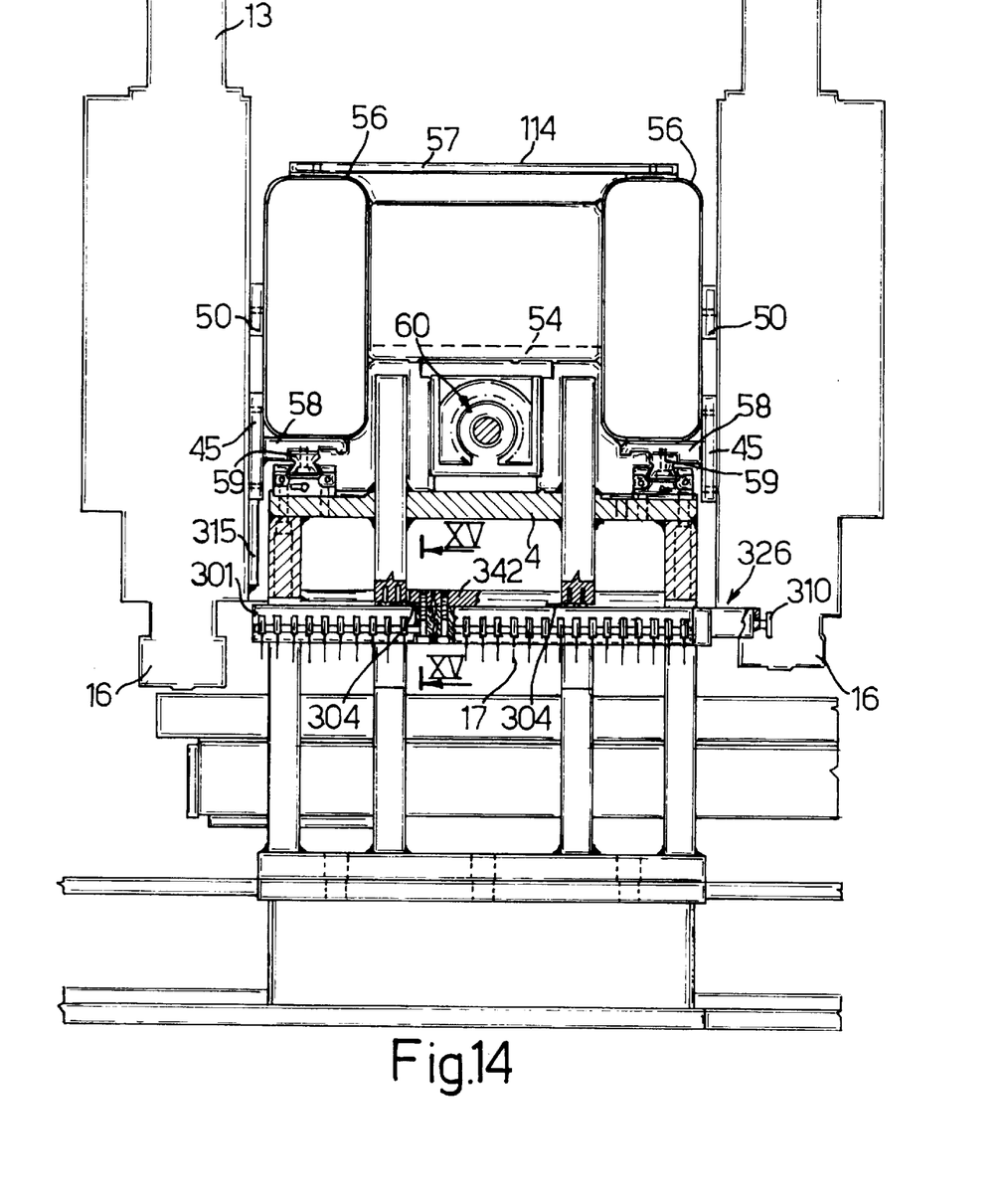
FIG. 14 shows a larger-scale vertical section along line XIV—XIV in FIG. 12.

For each box 301, support 342 carries two guides defined by two bars 308, 309 parallel to the Y axis, and for guiding the two edges 302 of box 301. Bars 308 form a single guide, whereas bars 309 form two opposite guides for two edges 302 of two adjacent stores. In FIG. 13, the continuous lines indicate only one pair of bars 309, and the dash lines indicate the first pair of bars 308, 309 to the left. Of the other bars 308, 309, only the rows of holes for fastening bars 308, 309 are shown.

Figure 15:
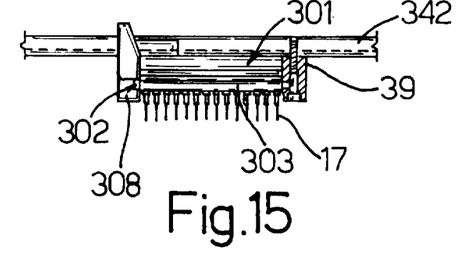
FIG. 15 shows a larger-scale section along line XV—XV in FIG. 14.

The total length of box 301 (FIG. 14) is such as to fit between the two heads 13, which may thus travel along the X axis without interfering with boxes 301. Each box 301 comprises a grip 310 by which to insert the box between corresponding bars 308 and 309; and a lock lever 311 (FIG. 15) pivots on one of guide bars 308, 309 of each box 301, and is activated manually to lock box 301 inside its seat. In FIG. 15, lever 311 is shown in the release position, and is rotated clockwise to lock box 301.

The left-hand bar 306 of support 342 is connected to the piston rod 312 of a pneumatic cylinder 313, which is normally activated to keep support 342 in a rest position, i.e. shifted fully to the right. cylinder 313 is a double-acting type, which therefore also provides for moving support 342 elastically leftwards.

Carriage 114 is fitted underneath with an appendix 314 located along the leftward trajectory of the first bar 308 of the seat of the first box 301 on the left, and which engages the right side of bar 308 when cylinder 313 is activated to move support 342 elastically leftwards. More specifically, appendix 314 is defined by a bent end of an arm 315 integral with the rear bar 45 of carriage 114.

Tools 17 are changed as follows.

When the packs of printed circuit boards are being machined, cylinder 313 (FIGS. 12 and 13) keeps support 342 in the rest position with appendix 314 detached leftwards from the first bar 308 on the left, so that carriage 114 may move machining heads 13 freely.

If the required tools 17 are located in boxes 301 to the right of the pairs of heads 13 in the FIG. 12 position, the pairs of devices 24 in gaps 55 and the pair of devices 24 adjacent to the outer side of the right-hand fixtures 11 are used. Conversely, if the required tools 17 are located in boxes 301 to the left of the pairs of heads 13, the three pairs of deices 24 in gaps 55 and the pair adjacent to the outer side of the left-hand fixtures 11 are used.

The tools 17 of all eight machining heads 13 are changed simultaneously. More specifically, table 6 and carriage 114 are first moved to align heads 13 with devices 24, which extract the used tools 17; and cylinder 313 is then activated to move support 342 leftwards so that the side of the first bar 308 on the left engages appendix 314 of carriage 114.

Carriage 114 is then moved in numeric-control manner along the X axis to move support 342, and therefore stores 326, by means of appendix 314, and so align with devices 24 the columns of seats in stores 326 into which the used tools 17 are to be inserted. At the same time, table 6 is moved along the Y axis to align with respective devices 24 the strips 303 of the seats of tools 17 of rear heads 13; devices 24 insert tools 17 inside the respective seats; and carriage 114 and table 6 are then moved to insert the used tools 17 of the front row of heads 13 inside the respective seats.

Carriage 114 and table 6 are then moved a first time to select from stores 326 the new tools 17 for the rear row of heads 13, which are extracted from the respective seats by devices 24 in the rear row. The above, operation is then repeated to extract the new tools 17 for the front row of heads 13 by means of devices 24 in the front row; cylinder 313 is activated to restore support 342 to the rest position; and carriage 114 and table 6 are moved to align the eight devices 24 with heads 13 and simultaneously insert the new tools 17.

As compared with known systems, the advantages of the tool selection system according to the present invention will be clear from the foregoing description. In particular, the tool is selected along the X axis by means of a numeric-control movement already provided on the machine, and selection of tool 17 requires no additional members for activating support 42. Moreover, being a numeric-control movement, the store and tool-change device are positioned extremely accurately with respect to each other. Finally, in the case of a number of machining heads 13 on one carriage 114, 214, one mechanism is sufficient to connect the carriage to support 342, 92.

Clearly, changes may be made to the selection system as described and illustrated herein without, however, departing from the scope of the accompanying claims. For example, in the FIGS. 1–4 embodiment, devices 24a, 24b may be fixed on table 6, and stores 26a, 26b may be fitted to crosspiece 4 so as to travel along the X axis; and carriage 14a, 14b may be so connected to support 42 as to move support 42 positively in both opposite directions. Finally, in the FIGS. 12–15 embodiment, appendix 314 may be carried by one of heads 13 in the first pair on the left.

I claim:

1. A system for selecting tools from a tool store of a machine tool for machining printed circuit boards, said machine (1) comprising a device (24, 24a, 24b) for exchanging tools (17) between said store (26a, 26b, 126, 226, 326) and a spindle (16) of a machining head (13); said machining head (13) being carried by a carriage movable in a first direction (X); said store (26a, 26b, 126, 226, 326) having a number of locations for the tools (17); a worktable (6) being movable in a second direction (Y) perpendicular to said first direction (X); and said device (24, 24a, 24b) and said store (26a, 26b, 126, 226, 326) being movable relative to each other to select the required tool (17); characterized by activatable means (51, 71, 97, 314) for enabling said carriage (14a, 14b, 114, 214) to effect said relative movement as the carriage itself moves in said first direction (X).

2. A system as claimed in claim 1, characterized in that said activatable means (51, 71, 97, 314) enable said carriage (14a, 14b, 114, 214) to draw said store (26a, 26b, 126, 226, 326) or said device (24, 24a, 24b), as the carriage itself moves in said first direction (X), in opposition to the action of elastic return means (44, 75, 94, 313).

3. A system as claimed in claim 2, characterized in that a support (42, 66, 92, 342) movable parallel to said carriage (14a, 14b, 114, 214) and supporting said store (26a, 26b, 126, 226, 326) or said device (24, 24*a*, 24*b*); said activatable means (51, 71, 97, 314) comprising a first element (48, 79, 96, 314) carried by said carriage (14*a*, 14*b*, 114, 214) and for engaging said support (42, 66, 92, 342).

4. A system as claimed in claim 3, characterized in that said elastic return means comprise a spring (44, 75) for holding said support (42, 66) against a fixed stop (47, 76).

5. A system as claimed in claim 4, characterized in that said machine (1) comprises a number of machining heads (13) carried on a common carriage (114) movable along a crosspiece (4); said heads (13) being associated with a corresponding number of stores (126); each store (126) being carried by a respective movable support (66); and each head (13) being integral with a respective first element (79) for engaging the respective store (126).

6. A system as claimed in claim 5, characterized in that each store (126) comprises a container (63) having one row of tools (17); said support (66) being movable on a structure (64) carried by said crosspiece (4); and said structure (64) being rotated between an angular tool-change position for changing the tools (17), and an angular transfer position for transferring the tools (17) together with a remote store (61).

7. A system as claimed in claim 6, characterized in that said first element (79) provides for engaging a second element (76) on said container (63) when said structure (64) is set to said tool-change position; a transfer device (81) effecting transfer when said structure (64) is set to said transfer position.

8. A system as claimed in claim 7, characterized in that said carriage (114) carries a second number of machining heads (13); each machining head (13) in said second number being associated with a machining head (13) in the first number; and each of said stores (126) being associated with a pair of said machining heads (13).

9. A system as claimed in claim 4, characterized in that said first element (48) is carried by said carriage (114) and provides for engaging a further element (52) connected to said support (42).

10. A system as claimed in claim 4, characterized in that said first element is defined by a pin (48, 96) carried by an actuator (51, 97) which is activated to engage said further element (52, 98).

11. A system as claimed in claim 9, characterized in that said store (26*a*, 26*b*) is fixed, and comprises a number of tools (17) arranged in a matrix of rows and columns; said support (42) carrying said device (24*a*, 24*b*) and said further element (52); and said support (42) being movable along a straight guide (43) fitted to the bed (2) of the machine, to select one of said columns of tools (17).

12. A system as claimed in claim 9, characterized in that said store (226) comprises a drum (82) having a number of columns of tools (17), each column lying in a plane perpendicular to said second direction (Y); said drum (82) being rotated to select the column of tools (17) containing the required tool; said further element (98) being located on said support (92); and said support rotating said drum (82).

13. A system as claimed in claim 12, wherein the machine (1) comprises a number of machining heads (13) carried by a common carriage (214); each machining head (13) being associated with a corresponding drum (82) of tools (17); characterized in that each of said drums (82) is integral with a gear (89) meshing with a common rack (92); said pin (96) being carried by said carriage (214), and being activated to engage a cavity (98) between two appendixes (99) of said rack (92).

14. A system as claimed in claim 13, characterized in that said elastic return means comprise two pneumatic pistons (94) located at the two ends of said rack (92) to maintain the rack in a predetermined rest position; said pin (96) moving said rack (92) in two opposite directions.

15. A system as claimed in claim 3, characterized in that said elastic return means comprise a pneumatic cylinder (313) for normally maintaining said support (342) in a rest position; said cylinder (313) being so activated as to hold said support (342) resting elastically against said first element (314).

16. A system as claimed in claim 15, characterized in that said store (326) comprises a number of tools (17) arranged in a matrix of rows and columns; said support (342) being movable independently of said carriage (114) along a straight guide (308) parallel to said first direction (X) to select one of said columns of tools (17); and said device (24) being carried by said worktable (6).

17. A system as claimed in claim 15, characterized in that said machine (1) comprises a number of machining heads (13) carried by a common carriage (114) movable in said first direction (X); said heads (13) being associated with a corresponding number of stores (326); and said stores (326) being carried by said support (342).

18. A system as claimed in claim 17, characterized in that said carriage (114) carries a second number of machining heads (13); each machining head (13) in said second number being associated with a machining head (13) in the first number; and each of said stores (326) being associated with a pair of said machining heads (13), and being located between said two numbers of machining heads (13).

19. A system as claimed in claim 16, characterized in that said store (326) is defined by a number of strips (303), each supporting a row of tools (17); said number of strips (303) being located in a box (301) insertable inside a seat (308, 309) carried by said support (342); and manually operated locking means (311) being provided to lock said box (301) inside said seat (308, 309).

20. A system as claimed in claim 18, characterized in that the seat of the box (301) of each of said stores (326) is defined by a pair of straight guides (308, 309) perpendicular to the traveling direction of said carriage (114).

21. A system as claimed in claim 1, characterized in that said device (24, 24*a*, 24*b*) comprises a gripper (28) activatable to engage a tool (17); means (34) being provided to move said gripper (28) in a third direction (Z) perpendicular to said first direction (X) and said second direction (Y) to insert and withdraw a tool (17) into/from said spindle (16) and into/from one of the locations in said store (26*a*, 26*b*, 126, 226, 326).

* * * * *

UNITED STATES PATENT AND TRADEMARK OFFICE
CERTIFICATE OF CORRECTION

PATENT NO. : 6,059,704
DATED : May 9, 2000
INVENTOR(S) : Angelo RAITERI

It is certified that error appears in the above-indentified patent and that said Letters Patent is hereby corrected as shown below:

On the title page: Item

[73] Assignee: Pluritec Italia S.p.A., Borgomanero, Italy

Signed and Sealed this

Third Day of April, 2001

Attest:

NICHOLAS P. GODICI

*Attesting Officer*   Acting Director of the United States Patent and Trademark Office